(12) United States Patent
Chang et al.

(10) Patent No.: US 11,700,704 B2
(45) Date of Patent: Jul. 11, 2023

(54) ADJUSTABLE AIR BLOCKS FOR CABLE ROUTING

(71) Applicant: QUANTA COMPUTER INC., Taoyuan (TW)

(72) Inventors: Chun Chang, Taoyuan (TW); Yu-Syuan Lin, Taoyuan (TW); Ting-Kuang Pao, Taoyuan (TW); Yu-Ta Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 229 days.

(21) Appl. No.: 17/245,765

(22) Filed: Apr. 30, 2021

(65) Prior Publication Data
US 2022/0354015 A1    Nov. 3, 2022

(51) Int. Cl.
*H05K 7/14* (2006.01)

(52) U.S. Cl.
CPC .................................. *H05K 7/1491* (2013.01)

(58) Field of Classification Search
CPC ........ H05K 7/1491; H02G 3/32; H02G 3/263; H02G 3/0456; H02G 3/30; H02G 3/0406; H02G 3/26; H02G 11/00; H02G 3/0437; H02G 3/04; H02G 3/34; H02G 3/083; H02G 3/22; H02G 1/06; H02G 3/0418; H02G 1/08; H02G 3/0481; H02G 3/08; H02G 3/085; H02G 3/18; H02G 7/053; H02G 3/0487; H02G 3/126; H02G 1/00; H02G 11/003; H02G 3/0468; H02G 3/086; H02G 3/00; H02G 3/0412; H02G 3/0616; H02G 3/386; H02G 15/007; H02G 3/045; H02G 3/06; H02G 3/16; H02G 3/24; H02G 3/305; H02G 13/00; H02G 13/40; H02G 15/1806; H02G 3/0462; H02G 1/04; H02G 1/10; H02G 3/02; H02G 3/105; H02G 7/05; H02G 11/006; H02G 15/18; H02G 3/0443; H02G 3/0608; H02G 3/0691; H02G 3/088; H02G 3/28; H02G 7/08; H02G 7/10; H02G 15/00; H02G 3/03; H02G 3/0683; H02G 3/10; H02G 3/121; H02G 3/20; H02G 5/00; H02G 7/14; H02G 1/005; H02G 1/14; H02G 11/02; H02G 15/046; H02G 15/064; H02G 15/117; H02G 3/0431; H02G 3/065; H02G 3/125; H02G 3/36; H02G 3/38; H02G 3/388; H02G 5/025; H02G 7/06
See application file for complete search history.

(56) References Cited

U.S. PATENT DOCUMENTS 2,166,916 A  *  7/1939  Lombard ............... F16B 5/0685
                                                           248/222.12
4,566,660 A  *  1/1986  Anscher ................... F16L 3/13
                                                                24/453

(Continued)

*Primary Examiner* — Krystal Robinson
(74) *Attorney, Agent, or Firm* — Nixon Peabody LLP

(57) ABSTRACT

An adjustable air block for routing cables includes a housing, a first inner plate, and a second inner plate. The housing includes a central gate extending between a top end and a bottom end thereof. The first inner plate and the second inner plate are fastened at the top end of the housing. The first inner plate includes a first vertical portion adjustably coupled to a left edge of the central gate along a first inner surface. The second inner plate includes a second vertical portion adjustably coupled to a right edge of the central gate along a second inner surface.

20 Claims, 6 Drawing Sheets

(56) References Cited

U.S. PATENT DOCUMENTS

| | | | | |
|---|---|---|---|---|
| 5,640,478 | A * | 6/1997 | Roller | G02B 6/3869 |
| | | | | 385/136 |
| 5,950,968 | A * | 9/1999 | Sato | H05K 7/06 |
| | | | | 248/65 |
| 5,952,616 | A * | 9/1999 | Morrow | H05K 5/0247 |
| | | | | 174/72 A |
| 6,225,561 | B1 * | 5/2001 | Mori | B60R 16/0207 |
| | | | | 174/154 |
| 6,291,767 | B1 * | 9/2001 | Beecher, II | H04Q 1/06 |
| | | | | 174/58 |
| 6,456,772 | B1 * | 9/2002 | Daoud | G02B 6/4471 |
| | | | | 385/137 |
| 7,162,790 | B1 * | 1/2007 | Daniels | H02G 3/32 |
| | | | | 29/525.04 |
| 7,272,291 | B2 * | 9/2007 | Bayazit | G02B 6/4454 |
| | | | | 385/137 |
| 7,500,867 | B1 * | 3/2009 | Doglio | H01R 13/5841 |
| | | | | 439/456 |
| 8,816,199 | B1 * | 8/2014 | French | H05K 7/1491 |
| | | | | 174/59 |
| 8,864,085 | B2 * | 10/2014 | He | H02G 3/0418 |
| | | | | 361/752 |
| 9,494,700 | B2 * | 11/2016 | Henman | G01V 1/38 |
| 10,953,824 | B2 * | 3/2021 | Nakaizumi | F16B 2/08 |
| 11,269,148 | B2 * | 3/2022 | Wang | G02B 6/4261 |
| 2004/0161218 | A1 * | 8/2004 | Sloan | G02B 6/3807 |
| | | | | 385/136 |
| 2005/0067358 | A1 * | 3/2005 | Lee | H05K 7/1449 |
| | | | | 361/826 |
| 2006/0243868 | A1 * | 11/2006 | Nakamura | G02B 6/3636 |
| | | | | 248/113 |
| 2006/0273226 | A1 * | 12/2006 | Jatzke | F16L 3/223 |
| | | | | 248/68.1 |
| 2012/0228437 | A1 * | 9/2012 | Tatsuta | H02G 11/006 |
| | | | | 248/49 |
| 2014/0270677 | A1 * | 9/2014 | Sievers | G02B 6/4452 |
| | | | | 385/136 |
| 2015/0077935 | A1 * | 3/2015 | Wright | H05K 7/1491 |
| | | | | 248/65 |
| 2015/0086170 | A1 * | 3/2015 | Bridges | G02B 6/3616 |
| | | | | 385/135 |
| 2017/0155222 | A1 * | 6/2017 | Hsu | H05K 7/1489 |
| 2019/0069435 | A1 * | 2/2019 | Pei | H05K 7/1491 |

* cited by examiner

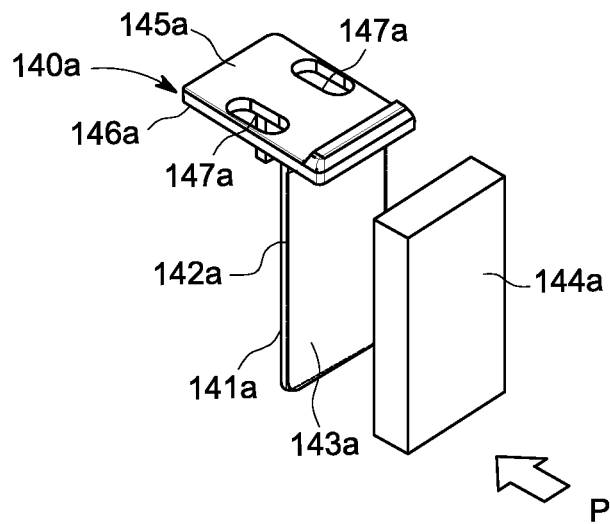 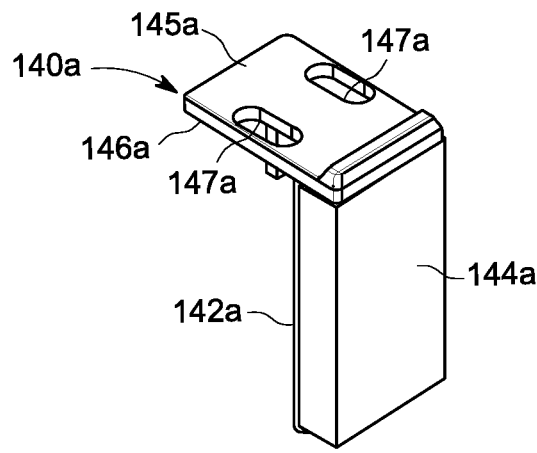
FIG. 2A  FIG. 2B
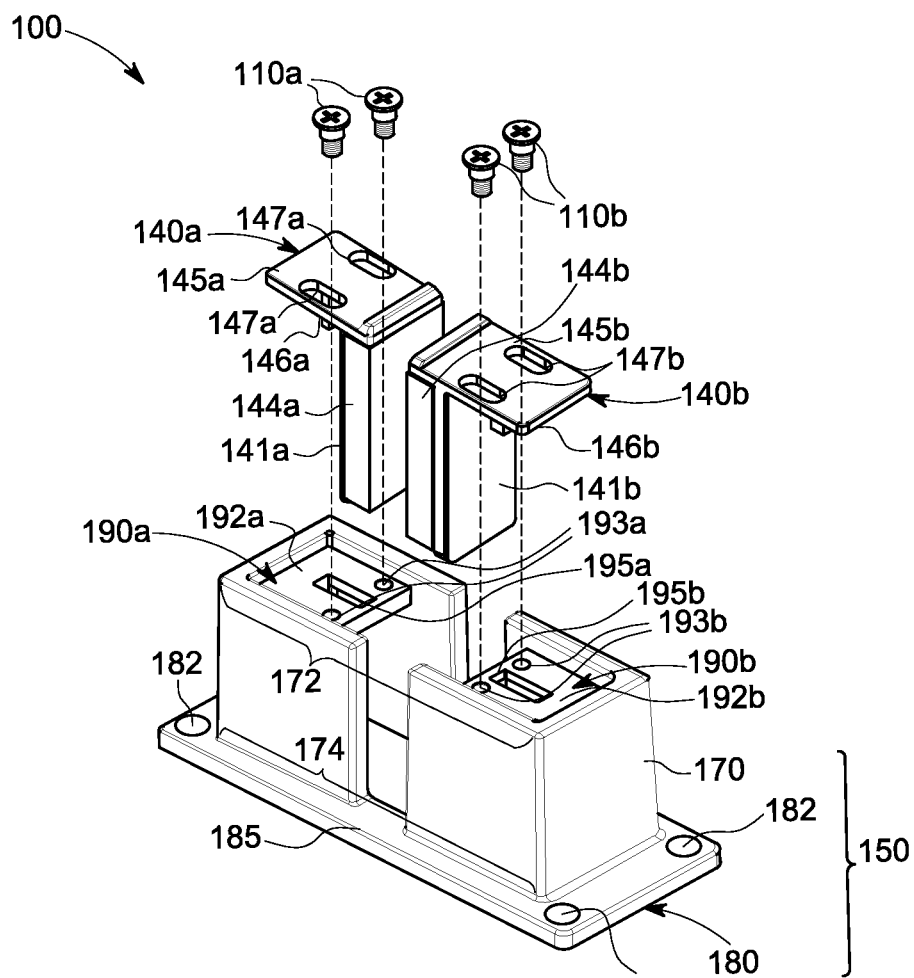
FIG. 3

ADJUSTABLE AIR BLOCKS FOR CABLE ROUTING

FIELD OF THE INVENTION

The present invention relates generally to management of cables in an electronic chassis, and more specifically, to an adjustable air block for routing cables within electronic chassis.

BACKGROUND OF THE INVENTION

Advancements in 5G technology have led to the growth of networks that require several interconnected devices having electronic chassis for receiving cables. The electronic chassis include electronic components that are connected through cables to other components, such as 5G Central Units (CU), distributed units (DU), Remote Radio Units (RRU), Active Antenna Units (AAU), and Radio Units (RU). These cables may have different sizes and different lengths. Without an organized way of aligning and routing the cables, the cables form clusters within the electronic chassis and become difficult to manage as they pass through the different electronic components in the electronic chassis. Accordingly, it is desirable to have an in-situ component in the electronic chassis for managing and routing the cables that connect the different electronic components in the electronic chassis.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, an adjustable air block for routing cables is disclosed. The adjustable air block includes a housing, a first inner plate, and a second inner plate. The housing includes a central gate extending between a top end and a bottom end thereof. The first inner plate and the second inner plate are fastened at the top end of the housing. The first inner plate includes a first vertical portion adjustably coupled to a left edge of the central gate along a first inner surface. The second inner plate includes a second vertical portion adjustably coupled to a right edge of the central gate along a second inner surface.

According to certain aspects of the present disclosure, an assembly having an adjustable air block for cable routing is disclosed. The assembly includes an assembly board, an adjustable air block and a plurality of cables. The adjustable air block includes a housing, a first inner plate, and a second inner plate. The housing includes a central gate extending between a top end and a bottom end thereof. The first inner plate and the second inner plate are fastened at the top end of the housing. The first inner plate includes a first vertical portion adjustably coupled to a left edge of the central gate along a first inner surface. The second inner plate includes a second vertical portion adjustably coupled to a right edge of the central gate along a second inner surface. The plurality of cables is routed through the adjustable air block between the first inner plate and the second inner plate.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIGS. 2A-2B show perspective views of assembling an inner plate with a flexible cushion layer to form the adjustable air block, according to certain aspects of the present disclosure.

FIG. 3 shows a perspective view of coupling inner plates to a block with a central gate to form the adjustable air block, according to certain aspects of the present disclosure.

Figure 1A:
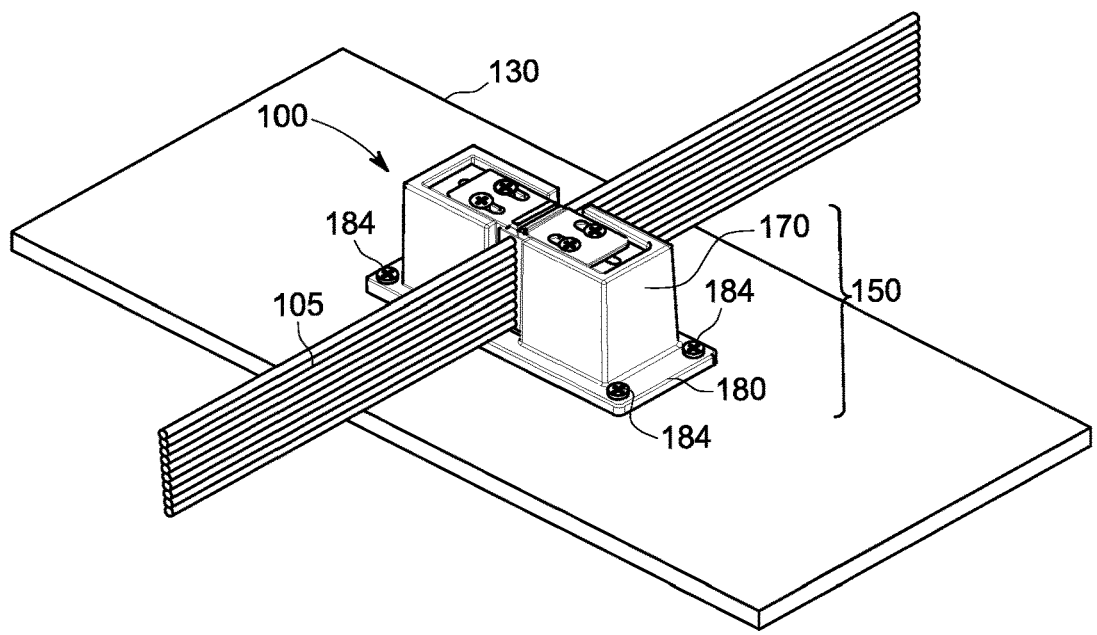
FIG. 1A shows a perspective view of an adjustable air block installed on an assembly board of an electronic chassis, according to certain aspects of the present disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Embodiments of the disclosure are directed to an adjustable air block for routing cables within an electronic chassis. The adjustable air block is an in-situ component in the electronic chassis for managing and routing the cables that connect the different electronic components in the electronic chassis. An air block for blocking and redirecting airflow in designated areas of the electronic chassis, such as between two modules of a server, is redesigned to create an adjustable central gate for organizing cables routed therethrough for connecting different electronic components in the electronic chassis.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1B:
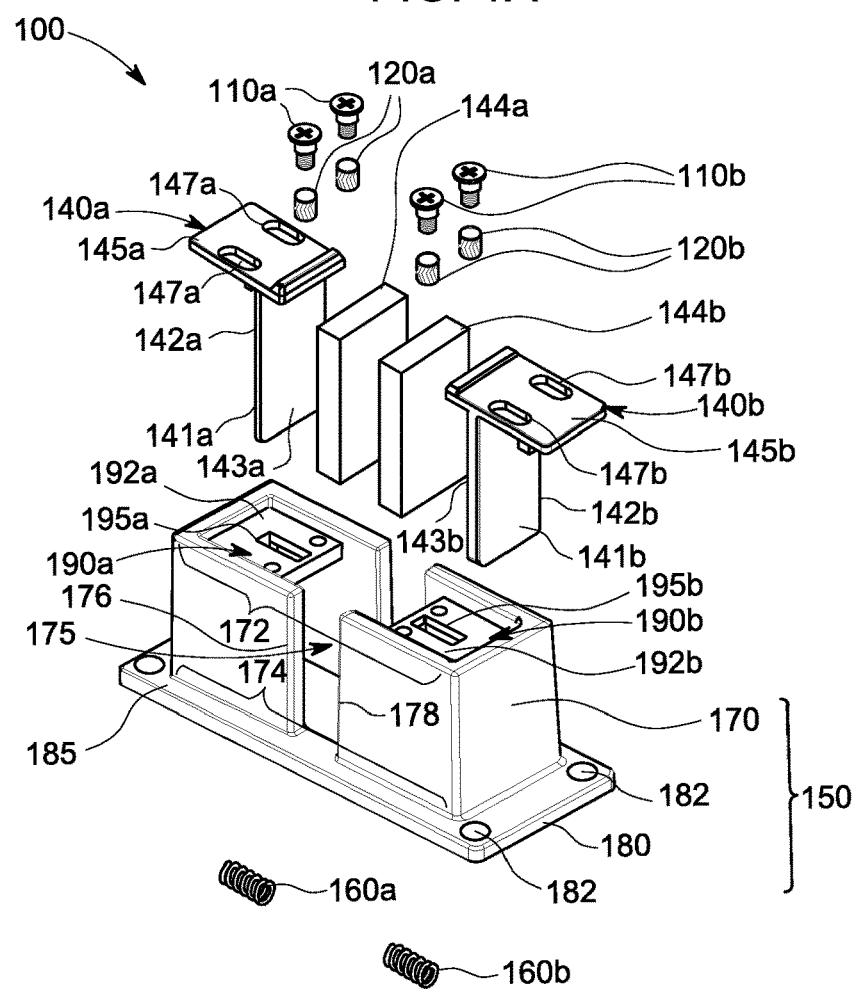
FIG. 1B shows an exploded view of the adjustable air block of FIG. 1A, according to certain aspects of the present disclosure.

FIG. 1A shows a perspective view of an adjustable air block 100 installed on an assembly board 130 of an electronic chassis, while FIG. 1B shows an exploded view of the adjustable air block 100. Referring to FIG. 1A, the adjustable air block 100 is shown installed on an assembly board 130. A plurality of cables 105 are routed through the adjustable air block 100, organized in a linear fashion for connecting different electronic components. As mentioned above, the adjustable air block 100 is an existing in-situ component on the assembly board 130 of an electronic chassis for blocking and redirecting airflow in designated areas of the electronic chassis. As shown in FIG. 1B, the adjustable air block 100 includes a housing 150, a first inner plate 140a, and a second inner plate 140b. The housing 150, the first inner plate 140a, and the second inner plate 140b are formed from a thermally insulating material such as, but not limited to, a plastic material.

The housing 150 includes a hollow cuboidal block 170 having a top end 172 and a bottom end 174. The block 170 further includes a central gate 175 extending between the top end 172 and the bottom end 174. The central gate 175 has a left edge 176 and a right edge 178. While the block 170 is cuboidal in shape in the embodiments shown, it is contemplated that the block 170 may be shaped as a sphere, pyramid, a cylinder having a base of any polygonal shape, and the like, in different embodiments.

The block 170 includes a left plate 190a and a right plate 190b at the top end 172. The left plate 190a forms a grooved upper surface 192a disposed left of the central gate 175 at the top end 172 thereof. The left plate 190a has holes 193a (shown in FIG. 3) on the upper surface 192a, a lower surface 194a (shown in FIG. 4A); and a first longitudinal opening 195a between the upper surface 192a and the lower surface 194a. The left plate 190a further includes a first knobbed protrusion 198a with a knob 199a (shown in FIG. 4A) through a leftmost end 196a of the first longitudinal opening 195a.

The right plate 190b forms a grooved upper surface 192b disposed right of the central gate 175 at the top end 172 thereof. The right plate 190b has holes 193b on the upper surface 192b, a lower surface 194b (shown in FIG. 4A); and a second longitudinal opening 195b between the upper surface 192b and the lower surface 194b. The right plate 190b further includes a second knobbed protrusion 198b with a knob 199b (shown in FIG. 4A) through a rightmost end 197b of the second longitudinal opening 195b.

In some embodiments, the housing 150 further includes a flat panel 180 coupled to the block 170 at the bottom end 174. The flat panel 180 forms a flanged rim 185 around the block 170. The four corners of the flat panel 180 include holes 182, which enable the housing 150 to be installed on the assembly board 130. In some embodiments, the block 170 and the flat panel 180 are distinct pieces, while in other embodiments, the block 170 and the flat panel 180 form a single piece.

The first inner plate 140a is fastened to the top end 172 of the block 170 through screws 110a, which are secured to the block 170 using nuts 120a. The first inner plate 140a has a first vertical portion 142a and a first horizontal portion 145a. The first vertical portion 142a has a first inner surface 141a configured to be adjacent to the left edge 176 of the central gate 175 upon assembly, and a first outer surface 143a. The first vertical portion 142a is adjustably coupled to the left edge 176 along the first inner surface 141a through a first mechanical spring 160a, as described below. The first outer surface 143a of the first vertical portion 142a has a first flexible cushion layer 144a attached thereon. In some embodiments, the first flexible cushion later 144a is made from an elastomeric material such as, but not limited to, sponge, foam, and the like.

The first horizontal portion 145a of the first inner plate 140a is formed over the first vertical portion 142a to form an L-shaped bracket extending leftward of the block 170 at the top end 172, upon assembly. Thus, the first horizontal portion 145a is configured to extend leftward along the top end 172 of the block 170, when the first inner plate 140a is coupled to the left edge 176 of the central gate 175. The first horizontal portion 145a has a first bottom surface 146a (shown in FIG. 2A) having a third knobbed protrusion 148a with a knob 149a (shown in FIG. 4A). The first horizontal portion 145a further includes one or more apertures 147a for accommodating the screws 110a and nuts 120a used for coupling the first inner plate 140a to the block 170. While in the embodiments shown herein, the first horizontal portion 145a includes two apertures 147a, it is contemplated that the first horizontal portion 145a may have more or less number apertures 147a.

The second inner plate 140b is fastened to the top end 172 of the block 170 through screws 110b, which are secured to the block 170 using nuts 120b. The second inner plate 140b has a second vertical portion 142b and a second horizontal portion 145b. The second vertical portion 142b has a second inner surface 141b configured to be adjacent to the right edge 178 of the central gate 175 upon assembly, and a second outer surface 143b. The second vertical portion 142b is adjustably coupled to the right edge 178 along the second inner surface 141b through a second mechanical spring 160b, as described below. The second outer surface 143b of the second vertical portion 142b has a second flexible cushion layer 144b attached thereon. In some embodiments, the second flexible cushion later 144b is made from an elastomeric material such as, but not limited to, sponge, foam, and the like.

The second horizontal portion 145b of the second inner plate 140b is formed over the second vertical portion 142b to form an L-shaped bracket extending rightward of the block 170 at the top end 172, upon assembly. Thus, the second horizontal portion 145b is configured to extend rightward along the top end 172 of the block 170, when the second inner plate 140b is coupled to the right edge 178 of the central gate 175. The second horizontal portion 145b has a second bottom surface 146b (shown in FIG. 3) having a fourth knobbed protrusion 148b with a knob 149b (shown in FIG. 4A). The second horizontal portion 145b further includes one or more apertures 147b for accommodating the screws 110b and nuts 120b used for coupling the second inner plate 140b to the block 170. While the second horizontal portion 145b includes two apertures 147b in the embodiments shown herein, it is contemplated that the second horizontal portion 145a may have more or less number apertures 147b.

The third knobbed protrusion 148a in the first horizontal portion 145a of the first inner plate 140a is insertable through the first longitudinal opening 195a on the left plate 190a of the block 170. This allows the third knobbed protrusion 148a, upon assembly, to become aligned in height, with the first knobbed protrusion 198a on the left plate 190a such that the knobs 149a and 199a face each other. The first mechanical spring 160a is then adjustably disposed in the first longitudinal opening 195a between the knob 199a of the first knobbed protrusion 198a and the knob 149a of the third knobbed protrusion 148a.

Similarly, the fourth knobbed protrusion 148b in the second horizontal portion 145b of the second inner plate 140b is insertable through the second longitudinal opening 195b on the right plate 190b of the block 170. This allows the fourth knobbed protrusion 148b, upon assembly, to become aligned in height with the second knobbed protrusion 198b on the right plate 190b such that the knobs 149b and 199b face each other. The second mechanical spring 160b is then adjustably disposed in the second longitudinal opening 195b between the knob 199b of the second knobbed protrusion 198b and the knob 149b of the fourth knobbed protrusion 148b.

The secured attachment of the first mechanical spring 160a within the first longitudinal opening 195a enables the first inner plate 140a to be adjustably coupled to the left edge 176 of the central gate 175 of the block 170. Similarly, the secured attachment of the second mechanical spring 160b within the second longitudinal opening 195b enables the second inner plate 140b to be adjustably coupled to the right edge 178 of the central gate 175 of the block 170. As a result, compression and decompression of the first mechanical spring 160a and the second mechanical spring 160b enable the first inner plate 140a and the second inner plate 140b to be pressed apart and towards each other.

Steps of assembling the adjustable air block 100 are shown through FIGS. 2A, 2B, 3, 4A, 4B, and 5. FIGS. 2A-2B show perspective views of an initial step of assembling the first inner plate 140a with the first flexible cushion layer 144a. The first flexible cushion layer 144a is attached to the first inner plate 140a, by applying a pressure P against the first outer surface 143a of the first vertical portion 142a of the first inner plate 140a. Upon attachment, a top surface of the first flexible cushion layer 144a is flush with the first bottom surface 146a of the first horizontal portion 145a of the first inner plate 140a. The second inner plate 140b is similarly assembled with the second flexible cushion layer 144b, though not shown in FIGS. 2A-2B.

FIG. 3 shows a perspective view of coupling the first inner plate 140a and the second inner plate 140b to the block 170. The first inner plate 140a and the second inner plate 140b are aligned such that the first flexible cushion layer 144a and the second flexible cushion layer 144b face each other. The first inner plate 140a and the second inner plate 140b are then placed into the central gate 175. Upon placement, the first inner surface 141a of the first vertical portion 142a of the first inner plate 140a is aligned with the left edge 176 of the central gate 175, and the first bottom surface 146a of the first horizontal portion 145a rests on the upper surface 192a of the left plate 190a of the block 170. Similarly, the second inner surface 141b of the second vertical portion 142b of the second inner plate 140b is aligned with the right edge 178 of the central gate 175, and the second bottom surface 146b of the second horizontal portion 145b rests on the upper surface 192b of the right plate 190b of the block 170, upon placement.

The first inner plate 140a is then coupled to the block 170 by placing screws 110a through the apertures 147a on the first horizontal portion 145a of the first inner plate 140a and the holes 193a on the upper surface 192a of the left plate 190a on the block 170. Similarly, the second inner plate 140b is coupled to the block 170 by placing screws 110b through the apertures 147b on the second horizontal portion 145b of the second inner plate 140b and the holes 193b on the upper surface 192b on the right plate 190b of the block 170.

Figure 4A:
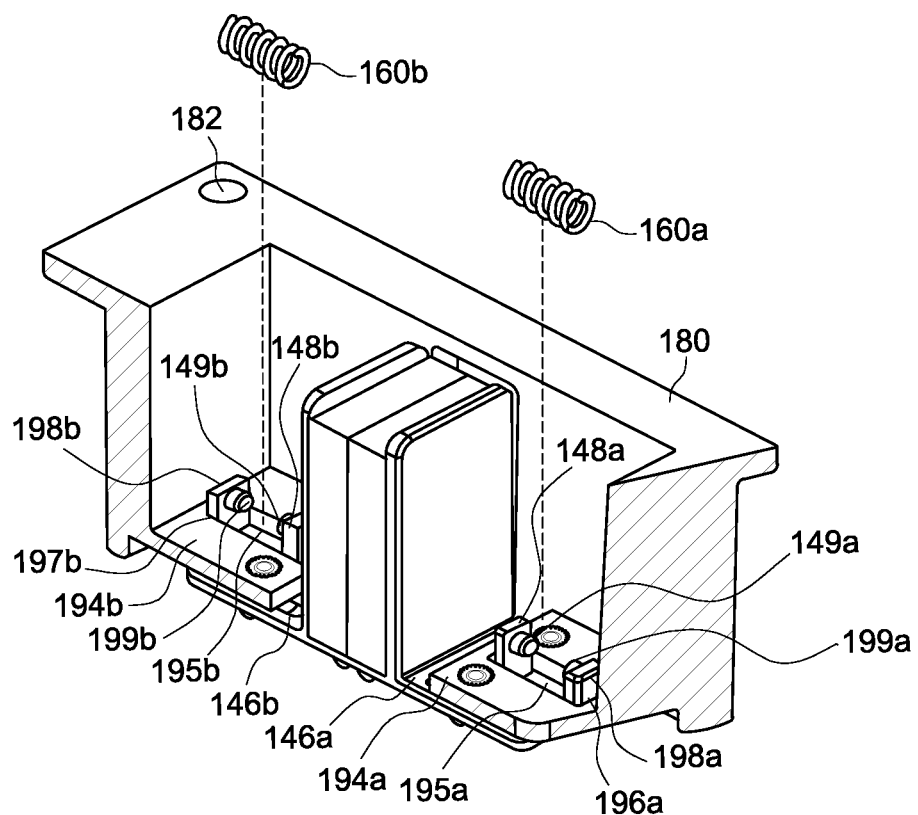
FIGS. 4A-4B show a cutaway bottom perspective view and a bottom view, respectively, of disposing mechanical springs in the block to form the adjustable air block, according to certain aspects of the present disclosure.
Figure 4B:
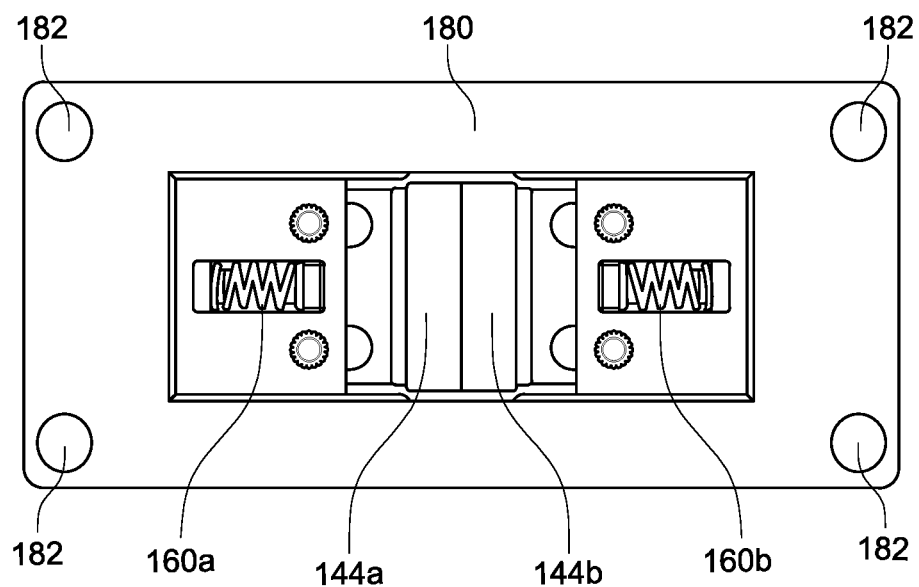

FIGS. 4A-4B show a cutaway bottom perspective view and a bottom view, respectively, of disposing the first mechanical spring 160a and the second mechanical spring 160b in the block 170. As described above, the first mechanical spring 160a is adjustably disposed in the first longitudinal opening 195a between the knob 199a of the first knobbed protrusion 198a and the knob 149a of the third knobbed protrusion 148a. Similarly, the second mechanical spring 160b is adjustably disposed in the second longitudinal opening 195b between the knob 199b of the second knobbed protrusion 198b and the knob 149b of the fourth knobbed protrusion 148b. The adjustable air block 100 is thus formed. The compression and decompression of the first mechanical spring 160a within the first longitudinal opening 195a and the second mechanical spring 160b within the second longitudinal opening 195b enable the first inner plate 140a and the second inner plate 140b to be pressed apart and towards each other. Thus, the central gate 175 of the block 170 can be adjustably opened and closed to accommodate the plurality of cables 105 having different sizes and lengths.

Figure 5:
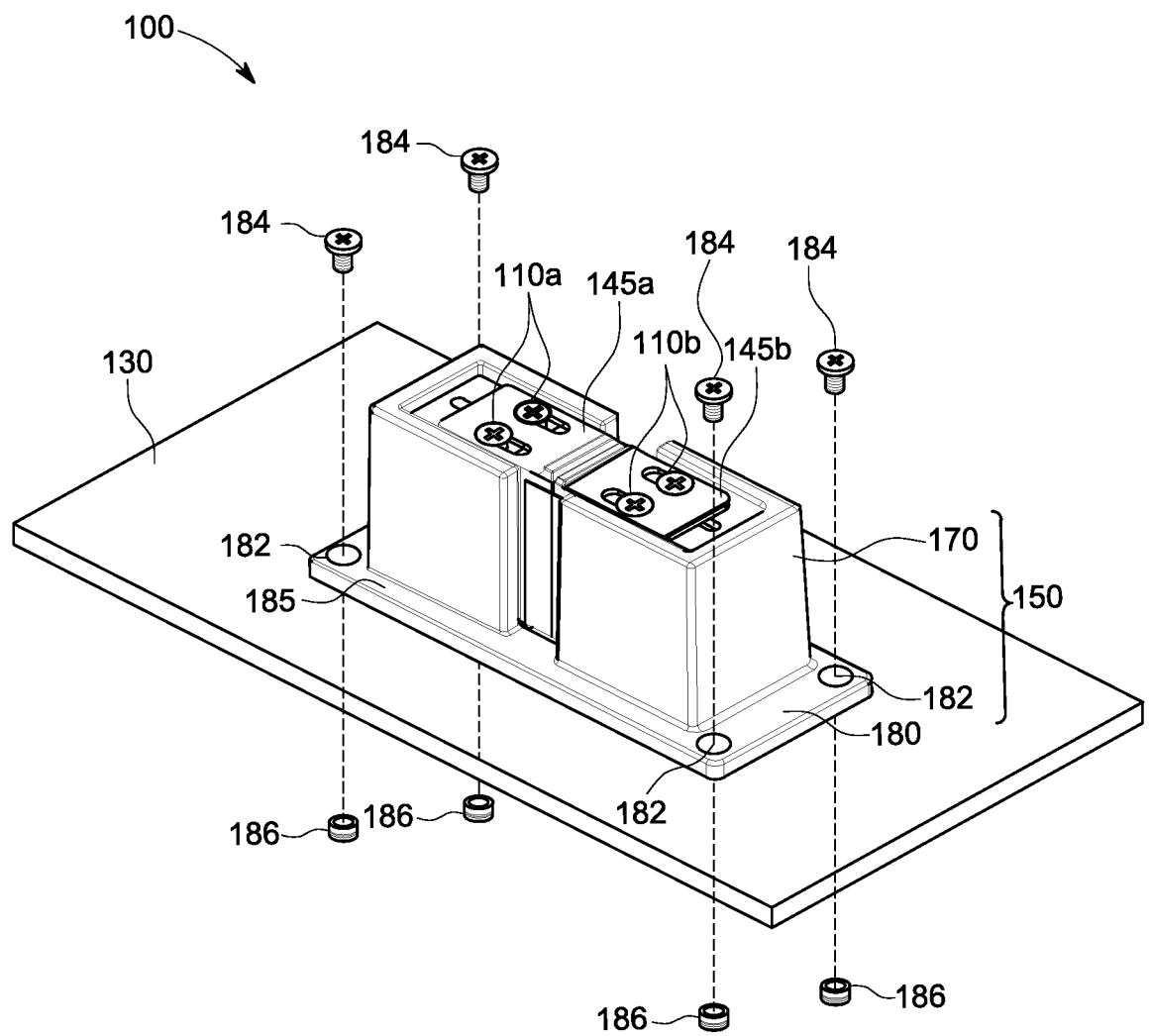
FIG. 5 shows a perspective view of installing the adjustable air block on the assembly board, according to certain aspects of the present disclosure.

FIG. 5 shows a perspective view of installing the adjustable air block 100 on the assembly board 130. Screws 184 are inserted through the holes 182 on the flanged rim 185 of the flat panel 180. The screws 184 are secured by nuts 186 through the bottom surface of the flat panel 180, thereby attaching the adjustable air block 100 to the assembly board 130.

Figure 6A:
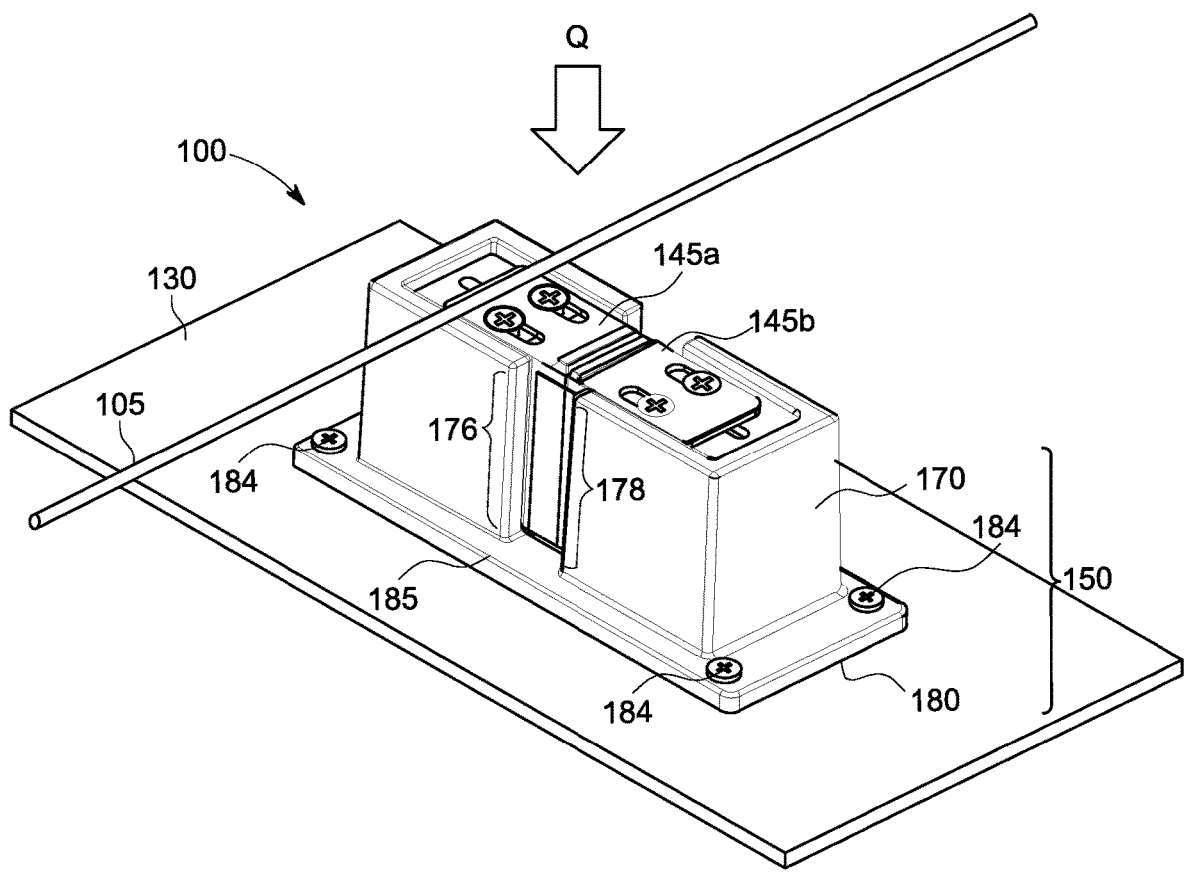
FIGS. 6A-6B show a perspective view and a bottom view respectively of the adjustable air block before a cable is routed therethrough, according to certain aspects of the present disclosure.
Figure 6B:
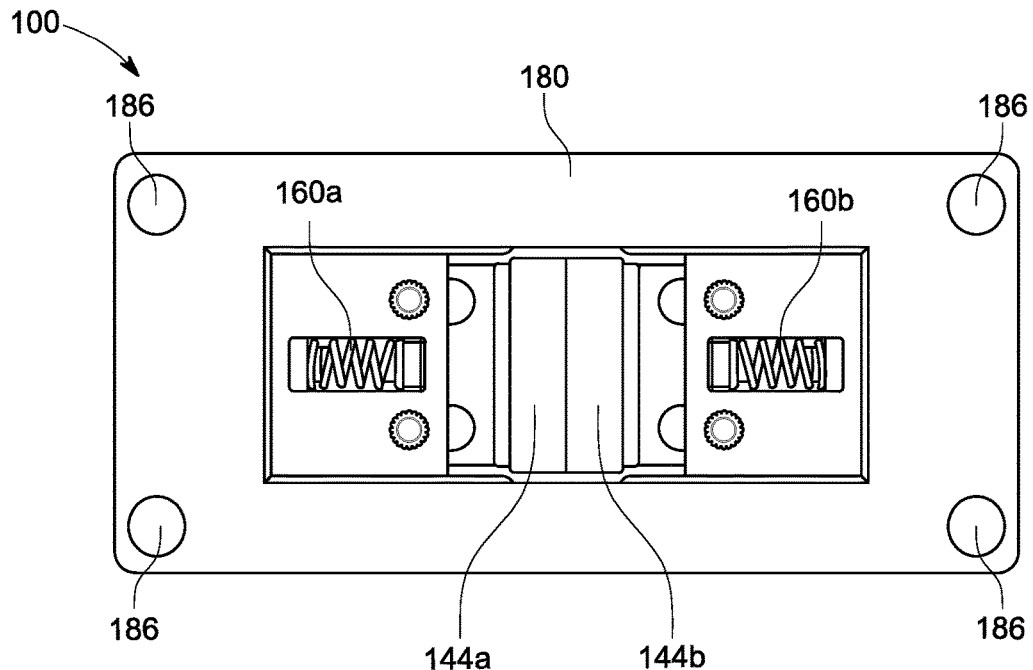

FIGS. 6A-6B show a perspective view and a bottom view, respectively, of the adjustable air block 100 before a cable 105 is routed therethrough. The cable 105 to be routed is pressed downwards with a force Q applied at the intersection of the first horizontal portion 145a of the first inner plate 140a, and the second horizontal portion 145b of the second inner plate 140b. The application of the force Q splits apart the first horizontal portion 145a and the second horizontal portion 145b, and slightly opens the central gate 175 of the block 170 between the first flexible cushion layer 144a and the second flexible cushion layer 144b. Further application of the force Q presses the first flexible cushion layer 144a and the second flexible cushion layer 144b apart.

Figure 7A:
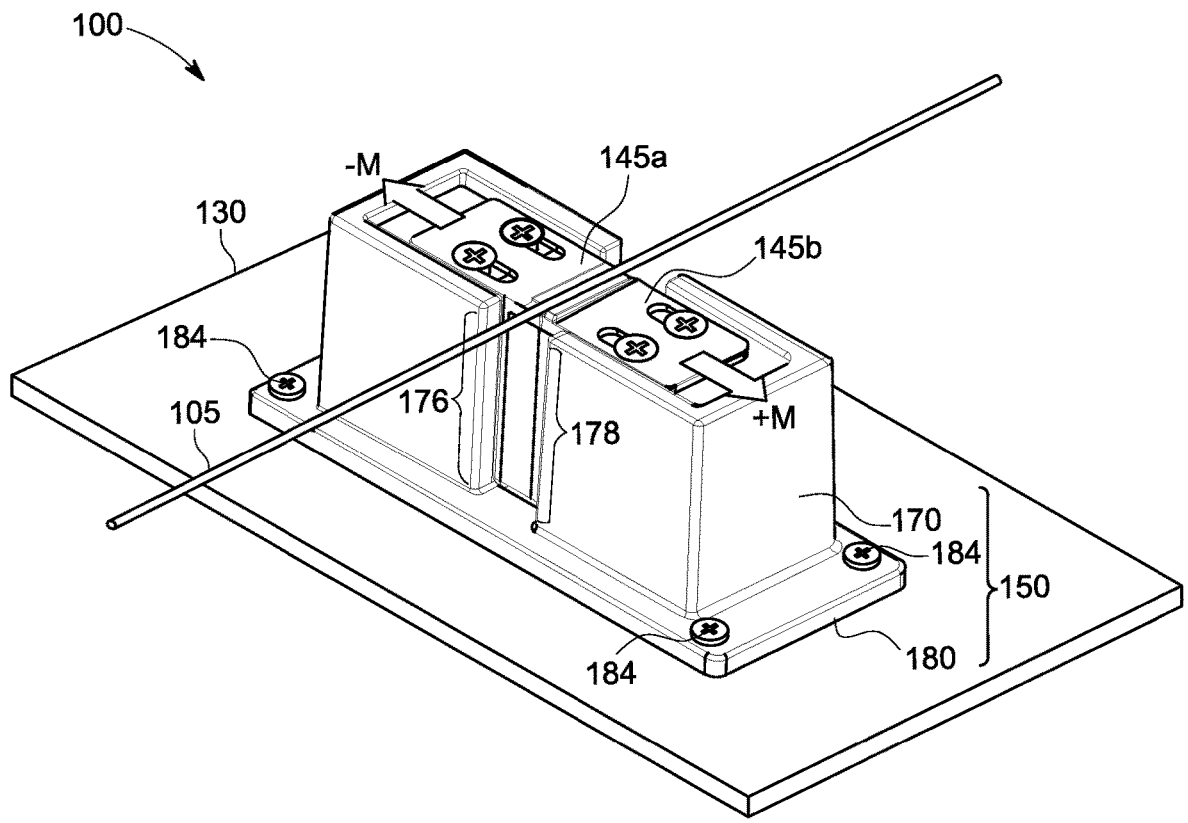
FIGS. 7A-7B show a perspective view and a bottom view, respectively, of the adjustable air block as a cable is routed therethrough, according to certain aspects of the present disclosure.
Figure 7B:
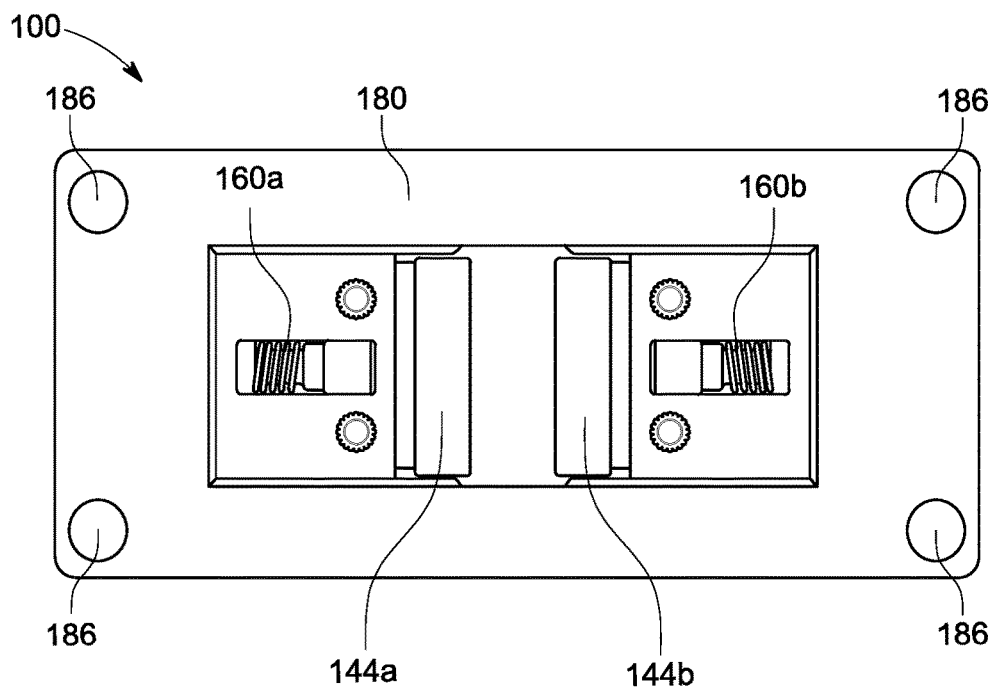

FIGS. 7A-7B show a perspective view and a bottom view respectively of the adjustable air block 100 as the cable 105 is routed therethrough. Two opposing horizontal components, +M and −M of the force Q presses the first flexible cushion layer 144a and the second flexible cushion layer 144b sufficiently apart, such that the first vertical portion 142a of the first inner plate 140a and the second vertical portion 142b of the second inner plate 140b also move in opposite directions along the plane of the flat panel 180. As a result, the first mechanical spring 160a is compressed within the first longitudinal opening 195a, and the second mechanical spring 160b is compressed within the second longitudinal opening 195b to accommodate the cable 105 between the first flexible cushion layer 144a and the second flexible cushion layer 144b. Once the cable 105 is accommodated, force Q is removed, causing the first mechanical spring 160a and the second mechanical spring 160b to decompress again such that the central gate 175 closes. The adjustable air block 100 returns to functioning as an air block. In this way, a plurality of cables 105 can be accommodated within the adjustable air block 100.

Advantageously, the adjustable air block, as described herein, reduces the use of cable clips and provides a flexible space for accommodating and routing cables of different sizes without having any openings within the structure. This allows the adjustable air block to continue blocking and redirecting airflow to other designated areas of the electronic chassis. The cables can be installed without threading them and the adjustable air block automatically clamps them after routing. This helps to optimize the number of mechanical structures in the chassis.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. An adjustable air block for routing cables, the adjustable air block comprising:
 a housing having a central gate extending between a top end and a bottom end thereof;
 a first inner plate fastened at the top end, the first inner plate having a first vertical portion adjustably coupled to a left edge of the central gate along a first inner surface; and
 a second inner plate fastened at the top end, the second inner plate having a second vertical portion adjustably coupled to a right edge of the central gate along a second inner surface.

2. The adjustable air block of claim 1, wherein:
 the first vertical portion is coupled to the left edge of the central gate through a first mechanical spring; and
 the second vertical portion is coupled to the right edge of the central gate through a second mechanical spring.

3. The adjustable air block of claim 1, wherein:
 the first vertical portion further comprises a first outer surface having a first flexible cushion layer; and
 the second vertical portion further comprises a second outer surface having a second flexible cushion layer.

4. The adjustable air block of claim 1, wherein the first mechanical spring and the second mechanical spring are configured to compress when the first inner plate and the second inner plate are pressed apart.

5. The adjustable air block of claim 1, wherein:
 the first inner plate further comprises a first horizontal portion configured to extend leftward along the top end of the block when the first inner plate is coupled to the left edge of the central gate, the first horizontal portion having a first bottom surface; and
 the second inner plate further comprises a second horizontal portion configured to extend rightward along the top end of the block when the second inner plate is coupled to the right edge of the central gate, the second horizontal portion having a second bottom surface.

6. The adjustable air block of claim 5, wherein each of the first horizontal portion and the second horizontal portion has one or more apertures for accommodating fasteners to couple the first inner plate and the second inner plate to the left plate and the right plate respectively.

7. The adjustable air block of claim 1, wherein the block further comprises:
 a left plate forming a grooved upper surface of the block disposed left of the central gate at the top end, the left plate having a lower surface, a first longitudinal opening, and a first knobbed protrusion through a leftmost end of the first longitudinal opening; and
 a right plate forming a grooved upper surface of the block disposed right of the central gate at the top end, the right plate having a lower surface, a second longitudinal opening, and a second knobbed protrusion through a rightmost end of the second longitudinal opening.

8. The adjustable air block of claim 7, wherein:
the first bottom surface of the first horizontal portion includes a third knobbed protrusion insertable through the first longitudinal opening on the left plate, the third knobbed protrusion aligned in height with the first knobbed protrusion on the left plate; and
the second bottom surface of the second horizontal portion includes a fourth knobbed protrusion insertable through the second longitudinal opening on the right plate, the fourth knobbed protrusion aligned in height with the second knobbed protrusion on the right plate.

9. The adjustable air block of claim 8, wherein:
the first mechanical spring is adjustably disposed in the first longitudinal opening between the first knobbed protrusion on the left plate and the third knobbed protrusion on the first horizontal portion; and
the second mechanical spring is adjustably disposed in the second longitudinal opening between the second knobbed protrusion on the right plate and the fourth knobbed protrusion on the second horizontal portion.

10. The adjustable air block of claim 1, wherein the first inner plate, the second inner plate, and the housing are formed from a thermally insulating material.

11. An assembly comprising:
an assembly board;
an adjustable air block comprising:
   a housing having a central gate extending between a top end and a bottom end thereof;
   a first inner plate fastened at the top end, the first inner plate having a first vertical portion adjustably coupled to a left edge of the central gate along a first inner surface; and
   a second inner plate fastened at the top end, the second inner plate having a second vertical portion adjustably coupled to a right edge of the central gate along a second inner surface; and
a plurality of cables routed through the adjustable air block between the first inner plate and the second inner plate.

12. The assembly of claim 11, wherein:
the first vertical portion is coupled to the left edge of the central gate through a first mechanical spring; and
the second vertical portion is coupled to the right edge of the central gate through a second mechanical spring.

13. The assembly of claim 11, wherein:
the first vertical portion further comprises a first outer surface having a first flexible cushion layer; and
the second vertical portion further comprises a second outer surface having a second flexible cushion layer.

14. The assembly of claim 11, wherein the first mechanical spring and the second mechanical spring are configured to compress when the first inner plate and the second inner plate are pressed apart.

15. The assembly of claim 11, wherein:
the first inner plate further comprises a first horizontal portion configured to extend leftward along the top end of the block when the first inner plate is coupled to the left edge of the central gate, the first horizontal portion having a first bottom surface; and
the second inner plate further comprises a second horizontal portion configured to extend rightward along the top end of the block when the second inner plate is coupled to the right edge of the central gate, the second horizontal portion having a second bottom surface.

16. The assembly of claim 15, wherein each of the first horizontal portion and the second horizontal portion has one or more apertures for accommodating fasteners to couple the first inner plate and the second inner plate to the left plate and the right plate respectively.

17. The assembly of claim 11, wherein the block further comprises:
a left plate forming a grooved upper surface of the block disposed left of the central gate at the top end, the left plate having a lower surface, a first longitudinal opening, and a first knobbed protrusion through a leftmost end of the first longitudinal opening; and
a right plate forming a grooved upper surface of the block disposed right of the central gate at the top end, the right plate having a lower surface, a second longitudinal opening, and a second knobbed protrusion through a rightmost end of the second longitudinal opening.

18. The assembly of claim 17, wherein:
the first bottom surface of the first horizontal portion includes a third knobbed protrusion insertable through the first longitudinal opening on the left plate, the third knobbed protrusion aligned in height with the first knobbed protrusion on the left plate; and
the second bottom surface of the second horizontal portion includes a fourth knobbed protrusion insertable through the second longitudinal opening on the right plate, the fourth knobbed protrusion aligned in height with the second knobbed protrusion on the right plate.

19. The assembly of claim 18, wherein:
the first mechanical spring is adjustably disposed in the first longitudinal opening between the first knobbed protrusion on the left plate and the third knobbed protrusion on the first horizontal portion; and
the second mechanical spring is adjustably disposed in the second longitudinal opening between the second knobbed protrusion on the right plate and the fourth knobbed protrusion on the second horizontal portion.

20. The assembly of claim 11, wherein the first inner plate, the second inner plate, and the housing are formed from a thermally insulating material.

* * * * *